United States Patent
Cok et al.

(10) Patent No.: US 10,937,679 B2
(45) Date of Patent: *Mar. 2, 2021

(54) HIGH-PRECISION PRINTED STRUCTURES

(71) Applicant: X Display Company Technology Limited, Dublin (IE)

(72) Inventors: Ronald S. Cok, Rochester, NY (US); David Gomez, Holly Springs, NC (US); Tanya Yvette Moore, Hurdle Mills, NC (US); Matthew Alexander Meitl, Durham, NC (US); Christopher Andrew Bower, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 15/930,371

(22) Filed: May 12, 2020

(65) Prior Publication Data
US 2020/0357677 A1 Nov. 12, 2020

Related U.S. Application Data

(63) Continuation of application No. 16/408,155, filed on May 9, 2019, now Pat. No. 10,714,374.

(51) Int. Cl.
*H01L 21/683* (2006.01)
*H01L 33/00* (2010.01)
(Continued)

(52) U.S. Cl.
CPC .......... *H01L 21/6835* (2013.01); *H01L 21/52* (2013.01); *H01L 31/1892* (2013.01); *H01L 33/0095* (2013.01)

(58) Field of Classification Search
CPC . H01L 24/83; H01L 25/0753; H01L 21/6835; H01L 31/1892; H01L 24/95
See application file for complete search history.

(56) References Cited

U.S. PATENT DOCUMENTS 6,142,358 A 11/2000 Cohn et al.
7,195,733 B2 3/2007 Rogers et al.
(Continued)

FOREIGN PATENT DOCUMENTS

WO WO-2020/225443 A1 11/2020

OTHER PUBLICATIONS

Invitation to Pay Additional Fees, PCT/EP2020/062945, filed May 8, 2020, 7 pages, (dated Aug. 11, 2020).
(Continued)

*Primary Examiner* — Changhyun Yi
(74) *Attorney, Agent, or Firm* — William R. Haulbrook; Michael D. Schmitt; Choate, Hall & Stewart LLP

(57) ABSTRACT

An example of a printed structure comprises a target substrate and a structure protruding from a surface of the target substrate. A component comprising a component substrate separate and independent from the target substrate is disposed in alignment with the structure on the surface of the target substrate within 1 micron of the structure. An example method of making a printed structure comprises providing the target substrate with the structure protruding from the target substrate, a transfer element, and a component adhered to the transfer element. The component comprises a component substrate separate and independent from the target substrate. The transfer element and adhered component move vertically toward the surface of the target substrate and horizontally towards the structure until the component physically contacts the structure or is adhered to the surface of the target substrate. The transfer element is separated from the component.

24 Claims, 18 Drawing Sheets

(51) Int. Cl.
*H01L 31/18* (2006.01)
*H01L 21/52* (2006.01)

(56) References Cited

U.S. PATENT DOCUMENTS

| | | |
|---|---|---|
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,470,701 B2 | 6/2013 | Rogers et al. |
| 8,506,867 B2 | 8/2013 | Menard |
| 8,558,243 B2 | 10/2013 | Bibl et al. |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 8,941,215 B2 | 1/2015 | Hu et al. |
| 8,987,765 B2 | 3/2015 | Bibl et al. |
| 9,049,797 B2 | 6/2015 | Menard et al. |
| 9,087,764 B2 | 7/2015 | Chan et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,355,854 B2 | 5/2016 | Meitl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 10,103,069 B2 | 10/2018 | Bower et al. |
| 10,153,256 B2 | 12/2018 | Cok et al. |
| 10,224,460 B2 | 3/2019 | Bower et al. |
| 10,714,374 B1* | 7/2020 | Cok ............ H01L 25/167 |
| 2003/0117369 A1 | 6/2003 | Spitzer et al. |
| 2003/0141570 A1 | 7/2003 | Chen et al. |
| 2010/0306993 A1 | 12/2010 | Mayyas et al. |
| 2012/0126229 A1 | 5/2012 | Bower |
| 2013/0285086 A1 | 10/2013 | Hu et al. |
| 2013/0309792 A1 | 11/2013 | Tischler et al. |
| 2013/0316487 A1 | 11/2013 | de Graff et al. |
| 2014/0159043 A1 | 6/2014 | Sakariya et al. |
| 2014/0267683 A1* | 9/2014 | Bibl ............ G09G 3/006 348/87 |
| 2016/0093600 A1 | 3/2016 | Bower et al. |
| 2017/0048976 A1 | 2/2017 | Prevatte et al. |
| 2017/0084577 A1 | 3/2017 | Carney et al. |
| 2017/0338374 A1 | 11/2017 | Zou et al. |

OTHER PUBLICATIONS

Bower, C. A. et al., Micro-Transfer-Printing: Heterogeneous Integration of Microscale Semiconductor Devises using Elastomer Stamps, IEEE Conference, (2014).
Bower, C. A. et al., Transfer Printing: An Approach for Massively Parallel Assembly of Microscale Devices, IEEE, Electronic Components and Technology Conference, (2008).
Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341, (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).
International Search Report for PCT/EP2020/062945, filed May 8, 2020, 5 pages, (dated Oct. 2, 2020).
Written Opinion for PCT/EP2020/062945, filed May 8, 2020, 14 pages, (dated Oct. 2, 2020).

\* cited by examiner

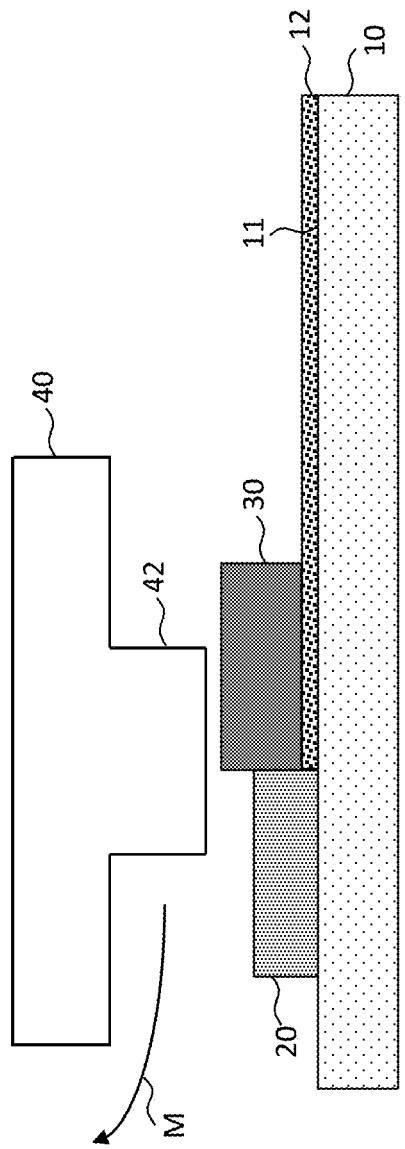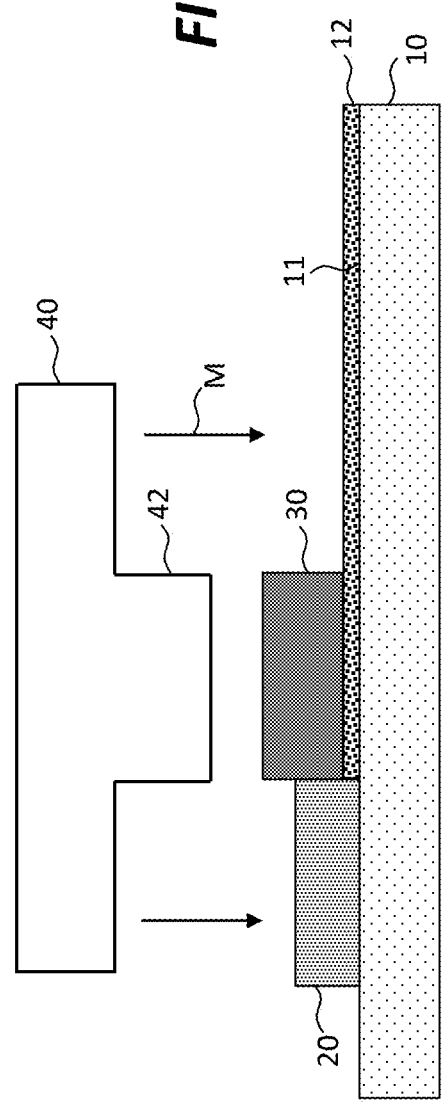

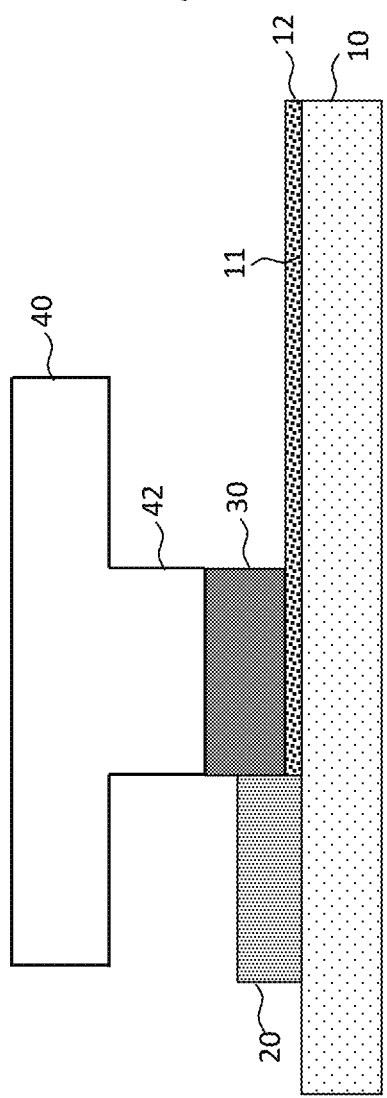
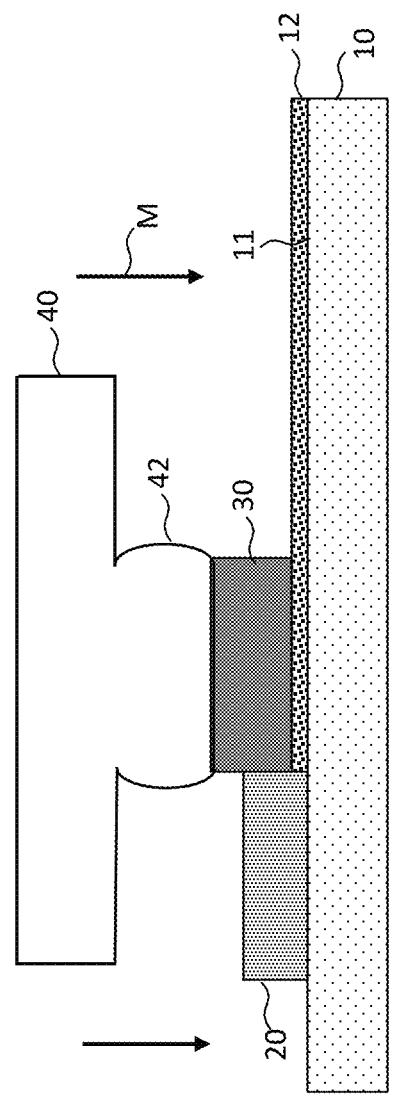

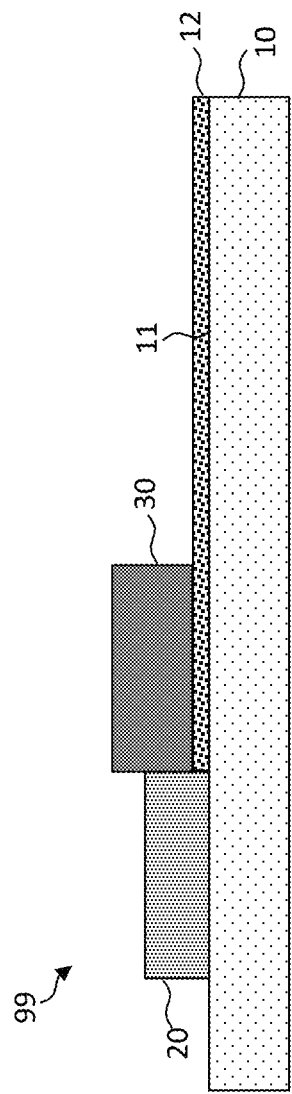

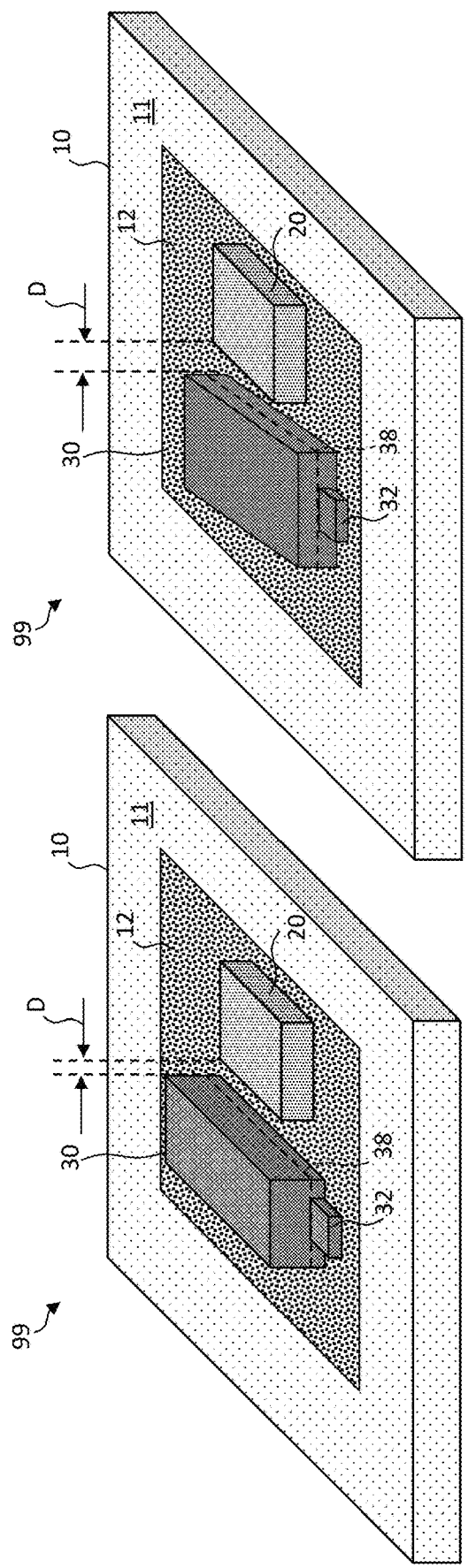

HIGH-PRECISION PRINTED STRUCTURES

PRIORITY APPLICATION

This application is a continuation of U.S. patent application Ser. No. 16/408,155, filed on May 9, 2020, the disclosure of which is hereby incorporated by reference herein in its entirety.

CROSS REFERENCE TO RELATED APPLICATION

Reference is made to U.S. patent application Ser. No. 16/186,173 filed Nov. 9, 2018 entitled "Interconnection by Lateral Printing" by Meitl et al., the disclosure of which is incorporated by reference herein in its entirety.

TECHNICAL FIELD

The present disclosure relates to printing components from a source wafer to a destination substrate with improved alignment accuracy using a transfer element, such as a stamp.

BACKGROUND

Substrates with electronically active components distributed over the extent of the substrate may be used in a variety of electronic systems, for example, in flat-panel display devices such as flat-panel liquid crystal or organic light emitting diode (OLED) displays, in imaging sensors, and in flat-panel solar cells. The electronically active components are typically either assembled on the substrate, for example using individually packaged surface-mount integrated-circuit devices and pick-and-place tools, or by depositing (e.g., sputtering or spin coating) a layer of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated systems.

Other methods for transferring active components from one substrate to another are described in U.S. Pat. No. 7,943,491. In an example of these approaches, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. The chiplets on the stamp are then pressed against a destination substrate or backplane with the stamp and adhered to the destination substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In certain applications, it can be important for transferred components to be located precisely and accurately on a destination substrate or backplane. When components are accurately located, they can be positioned closer together to form denser and smaller systems with improved performance. In particular, printed devices can be more accurately positioned with each other or with respect to photolithographically defined wires. For example, accurately positioned opto-electronic devices experience fewer conversion or connection losses. There is a need, therefore, for methods, devices, and structures to enable precise and accurate printing of components.

SUMMARY

The present disclosure provides, inter alia, structures, materials, and methods that enable precise and accurate printing (e.g., micro-transfer printing) of components from a native source wafer to a non-native target substrate in alignment with structures disposed on the target substrate.

According to some embodiments of the present disclosure, a method of making a printed structure (e.g., a micro-transfer printed structure) comprises providing a target substrate and a structure protruding from a surface of the target substrate, providing a transfer element and a component adhered to the transfer element, wherein the component comprises a component substrate that is separate and independent from the target substrate, moving the transfer element with the adhered component vertically toward the surface of the target substrate and horizontally towards the structure at least until the component physically contacts the structure or is adhered to the surface of the target substrate, and separating the transfer element from the component. The transfer element can be a viscoelastic stamp.

Some methods of the present disclosure comprise moving the transfer element toward the target substrate after the component physically contacts the structure or is adhered to the surface of the target substrate and before the transfer element is separated from the component in order to press the component toward the target substrate. Some methods of the present disclosure comprise moving the transfer element toward the target substrate after the transfer element is separated from the component to press the component toward the target substrate.

According to some embodiments, the component physically contacts the structure while the component is above and not in contact with the surface of the target substrate. According to some embodiments, the component physically contacts the structure while the component is in contact with the surface of the target substrate. Some methods of the present disclosure comprise moving the transfer element vertically away from the target substrate and horizontally toward the structure after the component physically contacts the structure.

According to some embodiments of the present disclosure, a printed structure (e.g., a micro-transfer-printed structure) comprises a target substrate and a structure protruding from a surface of the target substrate and a component in alignment with the structure. The component can comprise a component substrate separate and independent from the target substrate. According to some embodiments, the component is disposed on the surface of the target substrate within one micron (e.g., within 1.0 micron, within 0.75 microns, within 0.5 microns, within 0.25 microns, or within 0.1 microns) of the structure. In some embodiments, the component is disposed on the surface of the target substrate within five microns (e.g., within two microns) of the structure. The component can comprise a broken or separated tether. The component can be in contact with the structure. The structure can comprise a broken or separated tether.

According to some embodiments of the present disclosure, the component and the structure are aligned optical elements. For example, the structure comprises a waveguide, such as a light pipe, light conductor, or fiber optic element. The component, the structure, or both the component and the structure can comprise one or more of a laser, a light-emitting diode, a light sensor, and an optical fiber.

According to some embodiments of the present disclosure, the component has a length or a width or a length and a width less than or equal to 200 microns, less than or equal to 100 microns, less than or equal to 50 microns, less than or equal to 20 microns, less than or equal to 10 microns, less than or equal to 5 microns, less than or equal to 3 microns, less than or equal to 2 microns, or less than or equal to one micron.

In some configurations of the present disclosure, (i) the structure has a flat face adjacent to the component, (ii) the component has a substantially flat face adjacent to the structure, or (iii) both (i) and (ii). According to some embodiments, the structure has a non-planar face adjacent to the component and the component has a non-planar face complementary to the non-planar face of the structure. In some embodiments, at least a portion of the non-planar face of the structure is in contact with the non-planar face of the component.

According to some embodiments of the present disclosure, an adhesive is disposed on the surface of the target substrate. The adhesive can adhere the component to the target substrate. The adhesive can be disposed at least partially between the structure and the component.

According to some embodiments of the present disclosure, the structure, the component, or both the structure and the component are operable to receive or emit light. For example, both the structure and the component can comprise a light pipe and the light pipe in the structure can be in alignment with the light pipe in the component. In some embodiments, the structure comprises a light pipe and the component comprises a light emitter or light sensor in alignment with the light pipe in the structure. In some embodiments, the component comprises a light pipe and the structure comprises a light emitter or light sensor in alignment with the light pipe in the component.

According to some embodiments of the present disclosure, the component is disposed and operable to emit light to or receive light from the substrate, the structure is disposed and operable to emit light to or receive light from the substrate, or the component is disposed and operable to emit light to or receive light from the structure.

According to some embodiments of the present disclosure, the printed structure comprises a controller disposed on the surface of the substrate. The controller can be electrically connected to the component and operable to control operation of the component or the controller can be electrically connected to the structure and operable to control operation of the structure, or both.

According to some embodiments of the present disclosure, the printed structure comprises an encapsulation layer disposed at least partly over one or more of the component, the structure, and any gap between the component and the structure. The encapsulation layer can comprise or can be coated with a patterned or unpatterned light-reflective layer.

According to some embodiments, the component has a thickness equal to or greater than a thickness of the structure. The component can comprise a component material, the target substrate can comprise a substrate material, and the component material can be substantially different from the substrate material.

According to some embodiments of the present disclosure, the printed structure comprises a reflective material disposed (i) between the component and the target substrate, (ii) between the structure and the target substrate, or (iii) both (i) and (ii).

The component can be a first component and the printed structure can comprise a second component disposed on the surface of the target substrate within one micron (e.g., within 1.0 micron, within 0.75 microns, within 0.5 microns, within 0.25 microns, or within 0.1 microns) of the first component and the second component comprises a broken or separated tether.

The structure can comprise two or more structure faces, the component can comprise two or more component faces, and the component can be disposed on the surface of the target substrate so that at least one structure face is within one micron (e.g., within 1.0 micron, within 0.75 microns, within 0.5 microns, within 0.25 microns, or within 0.1 microns) of a component face.

The structure can comprise or have a structure face and the component can comprise or have a component face opposed or adjacent to the structure face. The structure face can comprise an indentation and the component face comprises a protrusion complementary to the indentation, for example complementary in shape, in size, or in both shape and size. The structure face can comprise a protrusion and the component face can comprise an indentation complementary to the protrusion, for example complementary in shape, in size, or in both shape and size. A protrusion can fit into an indentation, for example when complementary in shape, in size, or in both shape and size.

According to some embodiments, the component comprises connection posts. The connection posts can be sharp, can comprise a sharp point or can have a distal end with a smaller area than a base area. The connection posts can be electrically conductive and can electrically connect to an electrically active circuit or structure in the component.

Some embodiments of the present disclosure provide methods, devices, and structures that enable precise and accurate micro-transfer printing components from a native source wafer to a non-native destination substrate. The components can be aligned with the structures and can be optical components.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 2A-21 are successive cross sections of structures as described in the flow diagrams of FIGS. 1, 3A, and 3B according to illustrative embodiments of the present disclosure;

FIGS. 4A and 4B are perspectives of printed structures according to illustrative embodiments of the present disclosure;

FIG. 6 is a cross section of a printed structure according to illustrative embodiments of the present disclosure;

FIGS. 7-9 are cross sections of printed structures according to illustrative embodiments of the present disclosure;

FIG. 10 is a perspective of a printed structure according to illustrative embodiments of the present disclosure;

FIG. 12 is a cross-section of a component with connection posts according to illustrative embodiments of the present disclosure.

Figure 1:
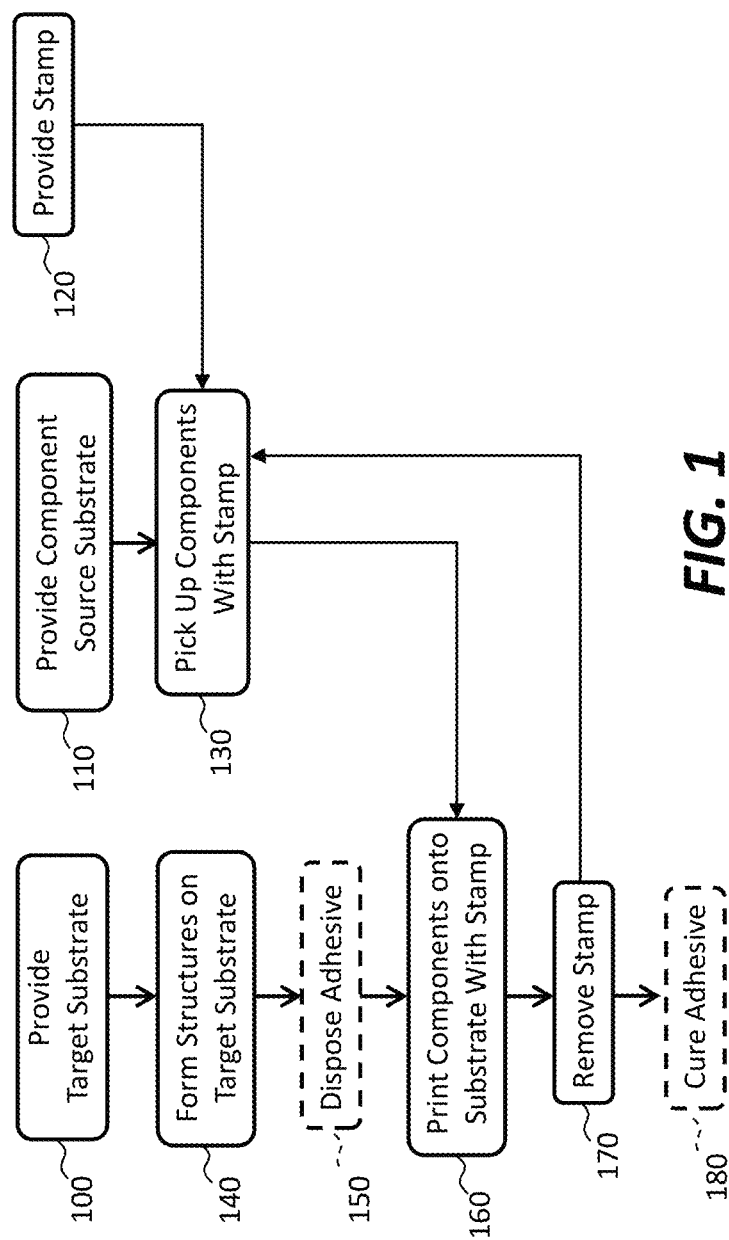
FIG. 1 is a flow diagram of methods according to illustrative embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Certain embodiments of the present disclosure are directed toward methods of printing (e.g., micro-transfer printing) components from a component source wafer onto a target substrate using a transfer element (e.g., stamp or other transfer device), and to structures extending or protruding from a surface of the target substrate. The structures can be used to align components to a location on the target substrate, to the structure, or to another component. Transfer-printed components are moved both vertically and horizontally over the target substrate to contact the structure and position the component on the target substrate with respect to the structure. The structure and the component can be aligned optical components.

Referring to the flow diagram of FIG. 1 and the successive cross sections and perspectives of FIGS. 2A-2H, according to some embodiments of the present disclosure a method of making a printed structure 99 comprises providing a target substrate 10 and a structure 20 protruding from a surface 11 of target substrate 10 in step 100. Optionally, substrate 10 is provided without structure 20 and structure 20 is constructed on or adhered to target substrate 10 in step 140. Structure 20 can be disposed, e.g., by micro-transfer printing, on surface 11 of target substrate 10 or target substrate 10 can comprise structure 20. Structure 20 can be formed or constructed on target substrate 10. A component source substrate such as a wafer substrate comprising native printable (e.g., micro-transfer printable) components 30 disposed thereon is provided in step 110. Each component 30 comprises a component substrate 38 separate and independent from target substrate 10 (shown in FIGS. 2A and 4 but omitted elsewhere for clarity) and from structure 20. A component substrate 38 can be, for example, a portion of the native wafer substrate or component source wafer or substrate on which component 30 is formed or constructed. A transfer element 40 (e.g., a viscoelastic stamp 40 with a stamp post 42) can be provided in step 120 and a component 30 adhered to transfer element 40 (for example to stamp post 42) by picking up component 30 from the component source substrate in step 130. In the present disclosure, for simplicity and clarity stamp 40 is referred to interchangeably with transfer element 40, but transfer element 40 is not limited to a stamp embodiment. Certain embodiments of the present disclosure contemplate and include transfer elements 40 other than stamps, for example vacuum, magnetic, and electrostatic grippers that are used to print components 30, structures 20, or both components 30 and structures 20, to target substrate 10. An optional adhesive layer 12 is optionally applied to surface 11 of target substrate 10 in optional step 150. Adhesive layer 12 can be coated on surface 11 of target substrate 10 or can be surface 11 of target substrate 10.

Figure 2A:
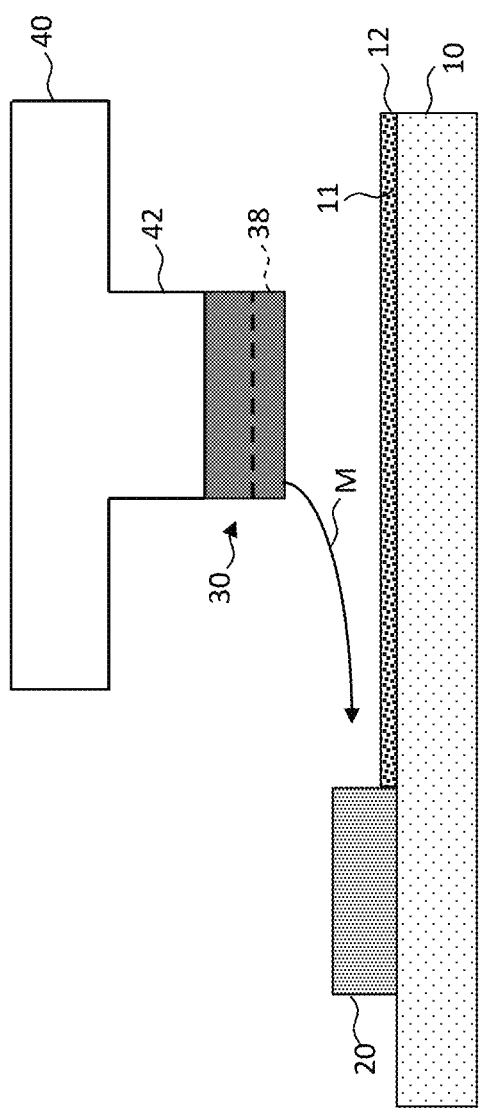
Figure 2B:
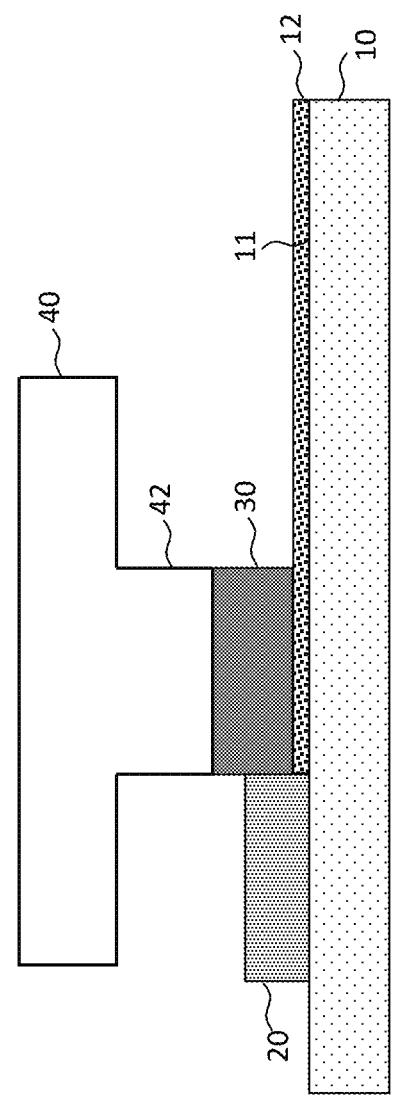
Figure 2G:
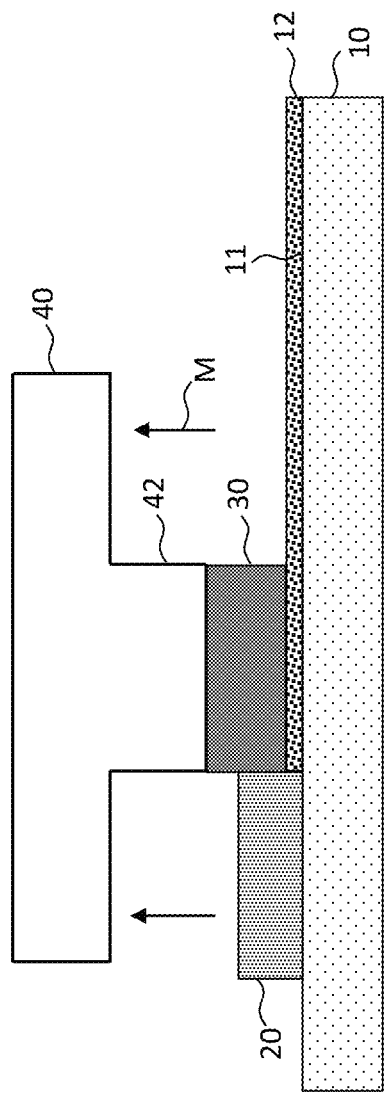
Figure 2H:
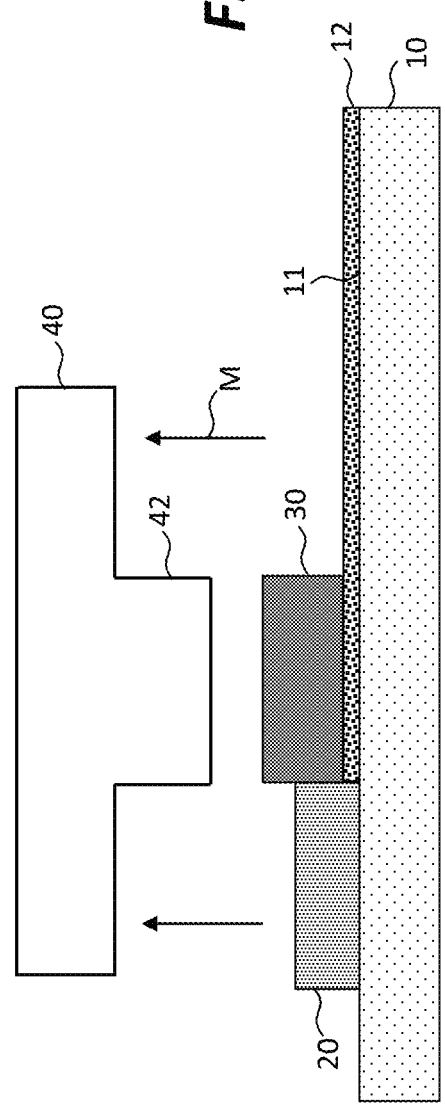
Figure 3B:
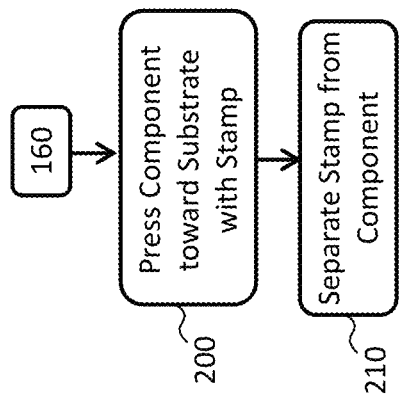
FIGS. 3A and 3B are flow diagrams of methods according to illustrative embodiments of the present disclosure.
Figure 3A:
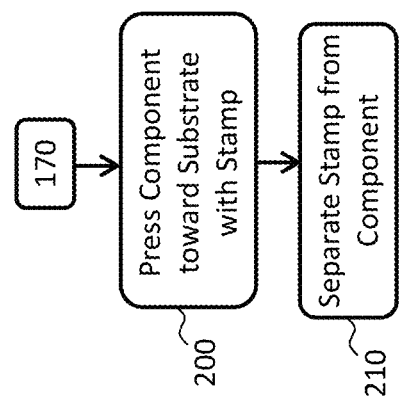

In step 160, transfer element 40 and adhered component 30 are moved vertically toward surface 11 of target substrate 10 and horizontally towards structure 20 in movement direction M (shown in FIG. 2A), either simultaneously or alternatively (e.g., first vertically and then horizontally, or vice versa), until component 30 physically contacts (e.g., directly contacts, strikes, or presses against) structure 20 (shown in FIG. 2B) or is adhered to surface 11 of target substrate 10 within a separation distance D that is within one micron (e.g., within 1.0 micron, within 0.75 microns, within 0.5 microns, within 0.25 microns, or within 0.1 microns) of structure 20. Transfer element 40 is separated (e.g., removed) from component 30 and target substrate 10 (shown in FIG. 2C) in step 170. Separation step 170 can comprise a movement of transfer element 40 in movement direction M such as only a vertical movement away from surface 11 of target substrate 10, for example as shown in FIGS. 2G and 2H or as exemplified in FIG. 2C, can comprise both a vertical movement away from surface 11 of target substrate 10 and a horizontal movement in a direction parallel to surface 11 of target substrate 10. Optionally, separation during step 170 can comprise movement such that at least a portion of stamp 40 or stamp post 42 moves toward structure 20, for example so that structure 20 scrapes component 30 off of stamp 40 or stamp post 42. At the conclusion of separation step 170, component 30 is disposed on target substrate 10 within a separation distance D of structure 20 (e.g., as shown in FIG. 4A). For example, component 30 can be in contact with structure 20 at the conclusion of separation step 170 (e.g., as shown in FIG. 2I). Multiple components 30 can be picked up and transferred as shown with the flow diagram arrow from step 170 to step 130 in FIG. 1. In certain embodiments, if optional adhesive layer 12 is provided in optional step 150, adhesive layer 12 is curable and is then optionally cured in optional step 180.

As used herein, vertical movement is defined as movement in a direction M substantially or effectively orthogonal to surface 11 of target substrate 10 and horizontal movement in a direction M is defined as movement substantially or effectively parallel to surface 11 of target substrate 10. A movement of transfer element 40 toward structure 20 means that at least a portion of transfer element 40 is moving toward structure 20, for example horizontally or vertically or both horizontally and vertically. A component 30 can be separated from transfer element 40 by moving transfer element 40 toward structure 20 at least horizontally and optionally vertically toward structure 20. Movement in a direction M can be temporally continuous or discontinuous, can move simultaneously in horizontal and vertical directions, or can alternate in horizontal and vertical directions. Movement can be in a straight line or in a curved line. A transfer element 40 can accelerate or decelerate during movement.

Depending on the amount and force of vertical motion in step 160, it can be helpful to additionally or repeatedly press component 30 toward (e.g., onto) surface 11 of target substrate 10, for example such that component 30 moves onto or into a layer such as adhesive layer 12 disposed on surface 11 of target substrate 10 after the conclusion of step 160 or step 170. If adhesive layer 12 is present, component 30 can be pressed on or into adhesive layer 12 and adhered to target substrate 10. Referring to the flow diagram of FIG.

Figure 5A:
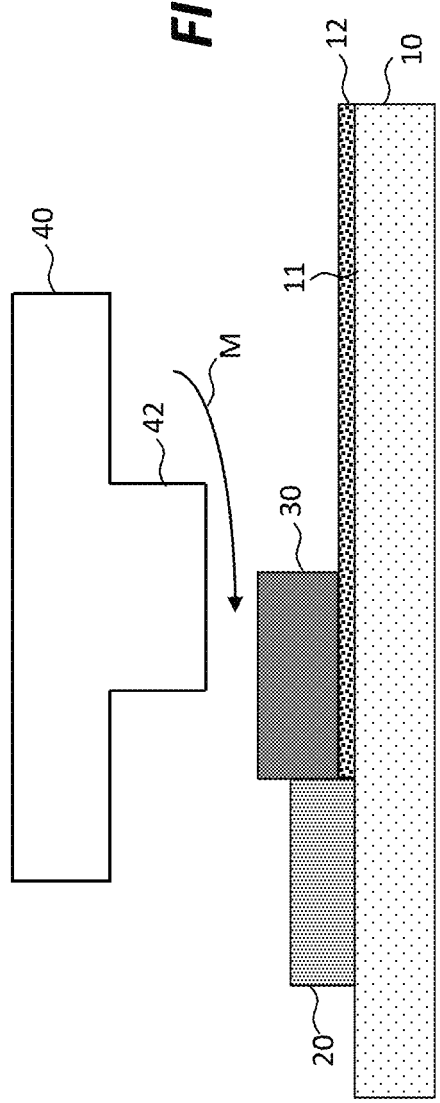
FIGS. 5A-5C are successive cross sections of structures following the flow diagrams of FIGS. 3A and 3B according to illustrative embodiments of the present disclosure.
Figure 5B:
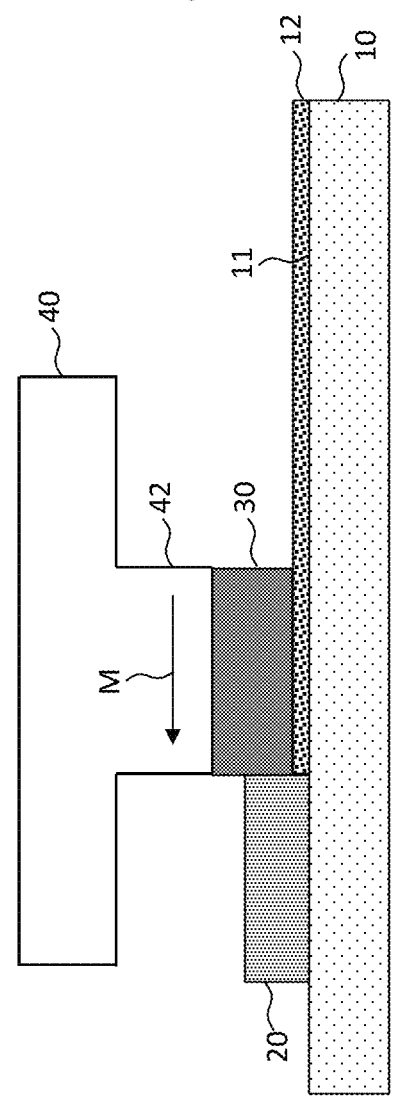
Figure 5C:
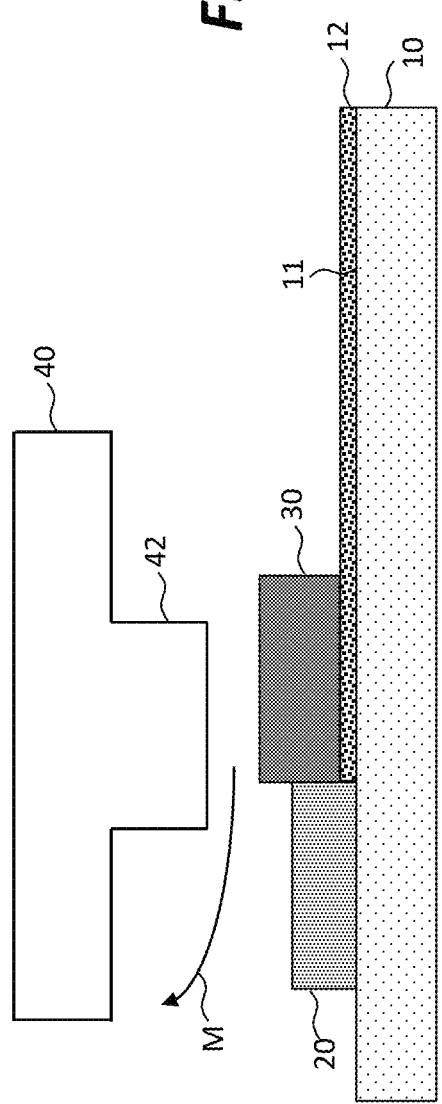

3A, FIGS. 2D-2H, and FIGS. 5A-5C, after stamp 40 is separated (e.g., removed) from component 30 in step 170, stamp 40 is then moved in direction M toward surface 11 of target substrate 10 in step 200 (e.g., vertically as shown in FIG. 2D) and component 30 is pressed onto surface 11 of target substrate 10 (e.g., as shown in FIG. 2E). As shown in FIG. 2F, the vertical motion of stamp 40 in direction M can compress stamp post 42. Stamp 40 is then moved in direction M vertically (e.g., as shown in FIGS. 2G and 2H) away from surface 11 of target substrate 10 in step 210 as in step 170. According to some methods of the present disclosure, transfer element 40 moves in direction M both horizontally and vertically toward target substrate 10 (e.g., as shown in FIG. 5A), contacts component 30 (e.g., as shown in FIG. 5B) in step 200 and then continues a horizontal and vertical motion in direction M away from target substrate 10 (e.g., as shown in FIG. 5C) in step 210. To facilitate contact between structure 20 and component 30 and enable movement of stamp 40, component 30 can have a thickness equal to or greater than a thickness of structure 20, so that transfer element 40 (e.g., stamp post 42 thereof) does not strike or otherwise physically contact structure 20 when transfer-printing component 30 to target substrate 10 or when separating stamp 40 from target substrate 10 (in steps 170, 210).

Referring to the flow diagram of FIG. 3B, FIGS. 2D-2H, and FIGS. 5A-5C, in some embodiments of the present disclosure, stamp 40 presses component 30 onto surface 11 of target substrate 10 after printing in step 160 but before stamp 40 is separated from component 30 (in step 170). Because transfer element 40 can comprise compressible viscoelastic materials, transfer element 40 can move vertically while maintaining contact with component 30, as shown in FIG. 2F. In some such embodiments, pressure is applied to component 30 by stamp 40 to micro-transfer print component 30 onto target substrate 10 in step 160. Optionally, pressure from stamp 40 is reduced but stamp post 42 remains in contact with component 30, and then pressure from stamp 40 is increased in step 200 and as shown in FIG. 2F to firmly position and adhere component 30 on target substrate 10 in alignment with structure 20, for example as shown in FIG. 2F. Stamp 40 is then separated (e.g., removed) from component 30 in step 210 (using vertical motion only, for example as shown in FIGS. 2G-2H, or using additional horizontal motion, for example as shown in FIGS. 2C and 5C). The steps of FIGS. 3A and 3B, FIGS. 2D-2H, or FIGS. 5A-5C can be iteratively repeated if necessary and as desired to properly position or adhere component 30, or both, with respect to structure 20 and on target substrate 10.

In some embodiments of the present disclosure component 30 is above and not in contact with surface 11 of target substrate 10 when component 30 physically contacts structure 20 due to movement of transfer element 40. In some embodiments of the present disclosure component 30 is in direct contact with surface 11 of target substrate 10 or is in direct contact with an adhesive layer 12 disposed on target substrate 10 (e.g., disposed in contact with surface 11 of target substrate 10 through adhesive layer 12) when component 30 physically contacts structure 20.

Figure 6:
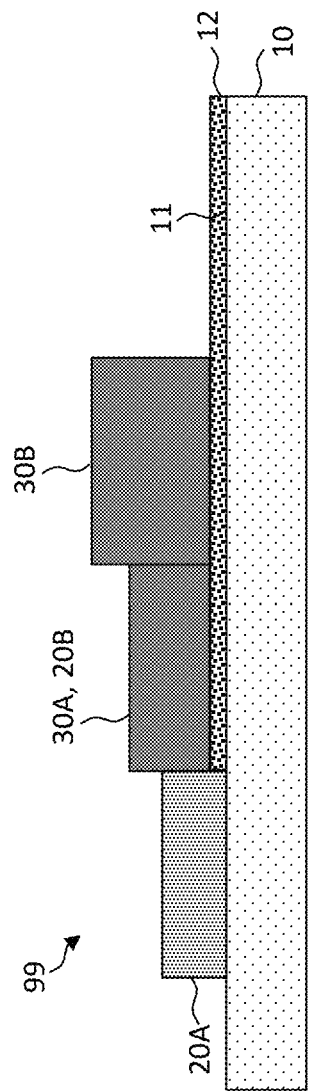

Some methods of the present disclosure can be iteratively repeated so that components 30 disposed on target substrate 10 can subsequently serve as a structure 20 when another component 30 is disposed on target substrate 10 (or on adhesive layer 12 disposed on surface 11 of target substrate 10) using the methods described above. Referring to FIG. 6, a first structure 20A is disposed on target substrate 10 and a first component 30A is disposed within a separation distance D (e.g., as shown in FIG. 4A). For example, first component 30A can be disposed in contact with first structure 20A (e.g., as shown in FIGS. 2I and 6) at a first time. At a second time later than the first time, second component 30B is disposed within a separation distance D (e.g., as shown in FIG. 4A). For example, second component 30B can be disposed in contact with first component 30A (second structure 20B, e.g., as shown in FIGS. 2I and 6) at the second time. When disposing second component 30B, first component 30A serves as a structure 20 (e.g., second structure 20B) for second component 30B so that second component 30B is aligned with first component 30A after disposition.

Some methods of the present disclosure accomplish component 30 transfers using micro-transfer printing (e.g., dry contact printing). Such printing methods can transfer components 30 formed on a native component source substrate. The component source substrate is processed to release components 30 (with component substrate 38) from the component source substrate so that components 30 are physically attached to the component source substrate only with one or more tethers 32 physically connecting components 30 to one or more anchors of the component source substrate. A stamp 40 contacts one or more components 30, adhering component 30 to stamp 40 (for example, to a stamp post 42). Stamp 40 separates and removes components 30 from the component source wafer, breaking (e.g., fracturing) or separating each tether 32 physically connecting each component 30 to the native component source wafer. For clarity, broken or separated tethers 32 are omitted from FIGS. 2A-2I and 5A-5C, but broken or separated tethers 32 are shown in FIGS. 4A and 4B (and FIGS. 7-11B discussed below). Stamp 40 then contacts the one or more components 30 adhered to stamp posts 42 to a target substrate 10.

Referring to FIGS. 2I, 4A, 4B, and 6, such a printed structure 99 can comprise a target substrate 10 having a structure 20 protruding from a surface 11 of target substrate 10. Structure 20 can be disposed with adhesive layer 12 between structure 20 and target substrate 10. A component 30 comprises a component substrate 38 separate and independent from target substrate 10, e.g., component 30 is non-native to target substrate 10. Component 30 can be disposed on surface 11 of target substrate 10 within one micron (e.g., within 1.0 micron, within 0.75 microns, within 0.5 microns, within 0.25 microns, or within 0.1 microns) of structure 20 (for example as shown in FIG. 4A). In some embodiments, component 30 is disposed in alignment with (e.g., substantially parallel to or no more than slightly askew relative to) structure 20. FIG. 4B shows an example printed structure 99 where component 30 is slightly askew relative to structure 20 and disposed within distance D (e.g., within one micron) of structure 20. In some embodiments, component 30 disposed within distance D of structure 20 has no portion of a face of component 30 that is adjacent to a face of structure 20 further than distance D away from the face of structure 20. In some embodiments, component 30 comprises a broken or separated tether 32. In some embodiments, component 30 is in contact with structure 20 (e.g., as shown in FIG. 2I) and component 30 is therefore within a separation distance D from structure 20 equal to zero microns. In some embodiments, structure 20 is also a transferred component 30 and comprises a broken (e.g., fractured), or separated tether 32 (not shown in the Figures).

If a second component 30 (e.g., second component 30B, as shown in FIG. 6) is disposed on target substrate 10 in alignment with and relatively close to a structure 20, (for example as shown in FIG. 4A), or a first component 30A (for example as shown in FIG. 6), second component 30B can be disposed on surface 11 of target substrate 10 within 1 micron, e.g., within 1.0 micron, within 0.75 microns, within 0.5 microns, within 0.25 microns, or within 0.1 microns of first component 30A (or structure 20). For example, second component 30B can be in contact with first component 30A (or structure 20). Second component 30B can comprise a broken or separated tether 32. In some embodiments, first component 30A and second component 30B are disposed in alignment with a common structure 20.

Micro-transfer printing is especially useful when transferring or otherwise disposing components 30 (e.g., first or second components 30A, 30B, or both) that are relatively small. In some embodiments, for example, component 30 has a length, a width, or both a length and a width less than or equal to 200 microns, e.g., less than or equal to 100 microns, less than or equal to 50 microns, less than or equal to 20 microns, less than or equal to 10 microns, less than or equal to 5 microns, less than or equal to 2 microns, or less than or equal to 1 micron in length or width and, optionally also has a thickness less than or equal to 50 microns, e.g., less than or equal to 25 microns, less than or equal to 10 microns, less than or equal to 5 microns, less than or equal to 2 microns, less than or equal to one micron, less than or equal to 0.5 microns, less than or equal to 0.2 microns, or less than or equal to 0.1 microns.

Figure 7:
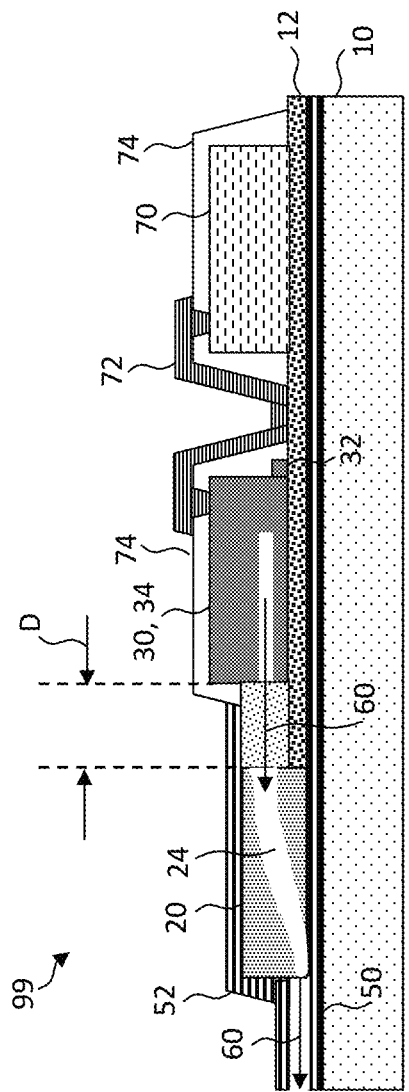

According to some embodiments of the present disclosure and as shown in FIG. 7, a printed structure 99 can comprise closely aligned components 30 or structures 20 that receive or emit light 60 (e.g., are operable to receive or emit light 60), such as photonic components 30 or photonic structures 20. Photonic components 30 or photonic structures 20 can be or include, for example, light pipes 24, light guides, or optical fibers that conduct light 60, light-emitting diodes, lasers, laser diodes, light sensors, or photodetectors. Thus, according to some embodiments of the present disclosure, the structure 20, the component 30, or both the structure 20 and the component 30 are operable to receive or emit light, both structure 20 and component 30 comprise a light pipe and the light pipe in structure 20 is in alignment with the light pipe in component 30, structure 20 comprises a light pipe and component 30 comprises a light emitter or light sensor in alignment with the light pipe in structure 20, or component 30 comprises a light pipe and structure 20 comprises a light emitter or light sensor in alignment with the light pipe in component 30.

In some embodiments, adhesive layer 12 is substantially transparent to light 60 that is received or emitted by components 30 or structures 20. A substantially transparent adhesive layer 12 is one that does not compromise the effective transmission of light 60 received or emitted by components 30 or structures 20, for example an adhesive layer 12 comprising an adhesive that is at least 50%, e.g., at least 75%, at least 80%, at least 85%, at least 90%, or at least 95% transparent to light 60 received or emitted by components 30 or structures 20. In some embodiments, adhesive layer 12 can conduct light 60, for example serve as, or as a portion of, a light pipe 24 (e.g., a light guide or fiberoptic channel) or can transmit light 60 between component 30 and structure 20. In some embodiments, an encapsulation layer 74 (for example, a dielectric layer 74) is disposed at least partly over any combination of component 30, structure 20, and any gap between component 30 and structure 20. Such a gap, for example can define or be a separation distance D as described above. Encapsulation layer 74 can comprise a light-reflective layer or encapsulation layer 74 can be coated with a light-reflective layer (for example upper light-reflective layer 52). Such a light-reflective layer, together with lower light-reflective layer 50, can control and direct light 60 as desired with respect to components 30 and structures 20.

In some embodiments, emitted or received light 60 is controlled or conducted by material optical index differences, for example as in a fiber-optic device. According to some embodiments, component 30 comprises a component material, target substrate 10 comprises a substrate material, and the component material is substantially different from the substrate material, for example comprising different material, having different material transparency, reflection, or absorption, or having different optical indices (e.g., having at least a 10% difference in refractive index). In some embodiments, target substrate 10 comprises a reflective material disposed between component 30 and target substrate 10 or between structure 20 and target substrate 10, e.g., lower light-reflective layer 50.

Referring to FIG. 7, target substrate 10 comprises or has disposed upon it a lower light-reflective layer 50 for example a patterned metal layer such as silver or aluminum that is sputtered or evaporatively deposited and patterned, for example using photolithographic methods and materials. Adhesive layer 12 is optionally disposed on target substrate 10 and lower light-reflective layer 50, for example by coating a curable liquid resin. Structure 20, for example comprising light pipe 24, is formed or disposed on target substrate 10 and lower light-reflective layer 50, for example using photolithographic methods and materials such as patterned silicon dioxide, silicon nitride, resins such as epoxies, and reflective materials, such as metals. Upper light-reflective layer 52 can be disposed over structure 20. Component 30 comprising micro-laser 34 (e.g., micro-diode laser 34) is disposed on target substrate 10 (for example by micro-transfer printing as described in FIG. 2A-2I and comprising a broken (e.g., fractured) or separated tether 32) adjacent to structure 20 within a separation distance D. Component 30 is aligned with structure 20 so that light-emitting diode micro-laser 34 emits laser light 60 into light pipe 24. In the illustration of FIG. 7, adhesive material, for example a portion of adhesive layer 12 is disposed between component 30 and structure 20 to fill any gap that would otherwise exist between component 30 and structure 20. The portion of adhesive layer 12 is effectively or substantially transparent to light 60 emitted micro-laser 34 and does not inhibit the effective transmission of light 60 between micro-laser 34 and light pipe 24.

As shown, for example, in FIG. 7, an integrated circuit 70, for example a controller, can also be disposed on target substrate 10, for example by micro-transfer printing. Integrated circuit 70 can be electrically connected to component 30, to structure 20, or to both controller 30 and structure 20, and can be operable to control component 30, to control structure 20, or to control both controller 30 and structure 20. Integrated circuit 70 can have a broken (e.g., fractured) or separated tether 32 (not shown in FIG. 7). A dielectric encapsulation layer 74 can be disposed over either or both of component 30 and integrated circuit 70 and patterned to enable an electrically conductive electrode 72 to be disposed over target substrate 10, component 30, and integrated circuit 70 to electrically connect component 30, and integrated circuit 70 and enable integrated circuit 70 to control component 30 (micro-laser 34) to emit light 60 into structure 20 (light pipe 24). Upper light-reflective layer 52 and lower light-reflective layer 50 can be patterned layers that, in combination with patterned organic or inorganic dielectric layers can form light pipes 24 that conduct or transmit light 60 from one location over or in target substrate 10 to another location over or in target substrate 10 and implement at least a portion of a photonic system, for example a computing or communication system. In some embodiments, upper light-reflective layer 52 can be disposed over structure 20, component 30, or both and lower light-reflective layer 50 can be disposed under structure 20, component 30, or both to assist in controlling light 60 or forming light pipes 24.

Figure 8:
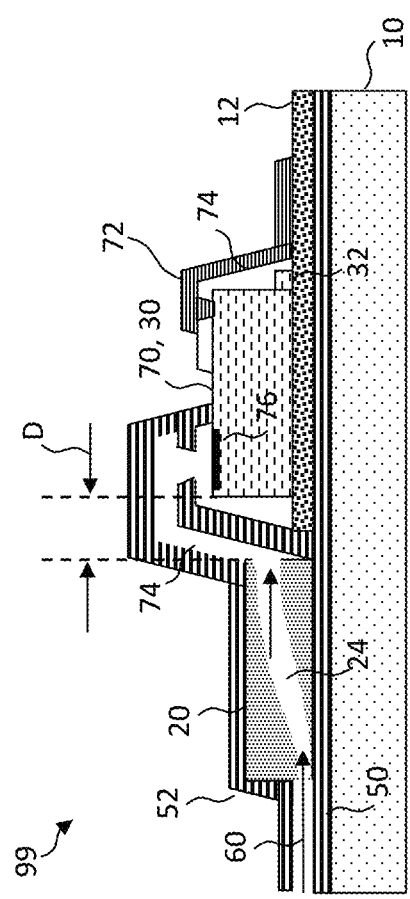

Referring to FIG. 8, in some embodiments of the present disclosure, component 30 is a light-receiving device, for example a photodetector or photosensor 76 in or of an integrated circuit 70, disposed in alignment with and within a separation distance D from structure 20 comprising a light pipe 24 adhered to target substrate 10 with adhesive layer 12. Light 60 travels between upper and lower light-reflective layers 52, 50, for example through a transparent patterned organic or inorganic encapsulation or dielectric layer 74 such as a layer of silicon dioxide or polymer, and is directed to a photosensor 76 in component 30. Micro-transfer printed component 30 comprises a tether 32 and can be electrically connected by electrodes 72 to a source of power, ground, or control or response signals.

Figure 9:
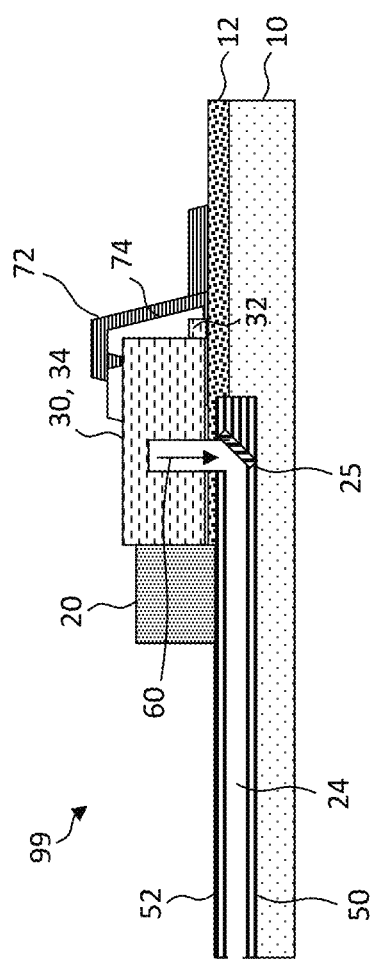

Referring to FIG. 9, light 60 can travel through light pipes 24 disposed within target substrate 10 rather than in patterned structures 20 provided on or above target substrate 10 in a printed structure 99 as in FIGS. 7 and 8. Light pipes 24 can comprise light reflectors 25 to assist in light 60 transport and conduction. As shown in FIG. 9, component 30 can be a light emitter such as a vertical-emitting diode micro-laser 34 (as opposed to the horizontal edge-emitting diode micro-laser 34 of FIG. 7) that receives power and control signals through electrodes 72 that are insulated from the semiconductor material of component 30 by patterned dielectric or encapsulation layers 74. In FIG. 9, structure 20 is an alignment structure that assists in positioning component 30 with respect to light pipe 24. Thus, according to some embodiments of the present disclosure, component 30 is disposed and operable to emit light to or receive light from target substrate 10, structure 20 is disposed and operable to emit light to or receive light from target substrate 10, or component 30 is disposed and operable to emit light to or receive light from target substrate 10.

Figure 10:
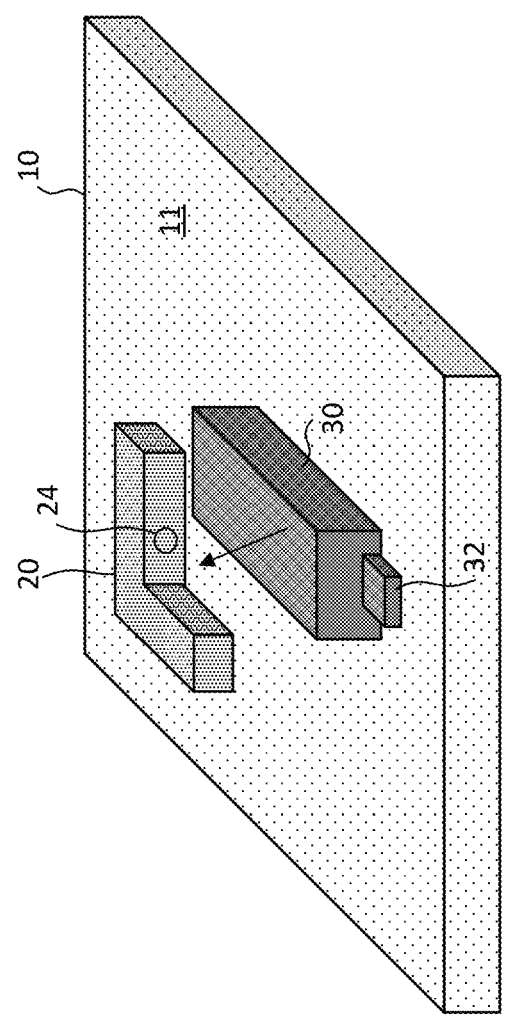

According to some embodiments of the present disclosure, and as shown in FIG. 10, structure 20 can have two or more structure faces that are not co-planar (two or more structure faces that are not in the same plane). Each individual structure face can be planar or non-planar, for example comprising a non-planar shape such as a curve or other non-flat shape). Component 30 can have one or more component faces complementary to the one or more structure faces, for example component faces matching those of structure 20. Complementary (e.g., matching) faces can fit closely together or can be in contact, or a portion of one face can fit into a matching or complementary other face. Such multiple component and structure faces can assist alignment of component 30 with structure 20 to prevent component 30 from being undesirably rotated with respect to structure 20. Thus, in some embodiments, component 30 is disposed on surface 11 of target substrate 10 within one micron (e.g., within 1.0 micron, within 0.75 microns, within 0.5 microns, within 0.25 microns, or within 0.1 microns) of the two-or-more non-planar faces of structure 20. In some embodiments, component 30 is disposed in contact with the two-or-more non-planar faces of structure 20 (and therefore has a separation distance D of zero microns). In some embodiments, a structure 20 and component 30 are within a separation distance D if any portion or structure face of structure 20 is in contact with or within separation distance D of any portion or component face of component 30.

As shown in FIG. 21, in some embodiments, (i) structure 20 has a flat face opposed to component 30, (ii) component 30 has a substantially flat face opposed to structure 20, or (iii) both (i) and (ii). The flat faces can be parallel to each other and thus enable close contact or a small separation distance between component 30 and structure 20. In some embodiments, structure 20 has a non-planar face opposed to component 30 and component 30 has a non-planar face complementary to the face of structure 20. According to some embodiments, at least a portion of the non-planar face of structure 20 is in contact with the non-planar face of component 30.

Figure 11A:
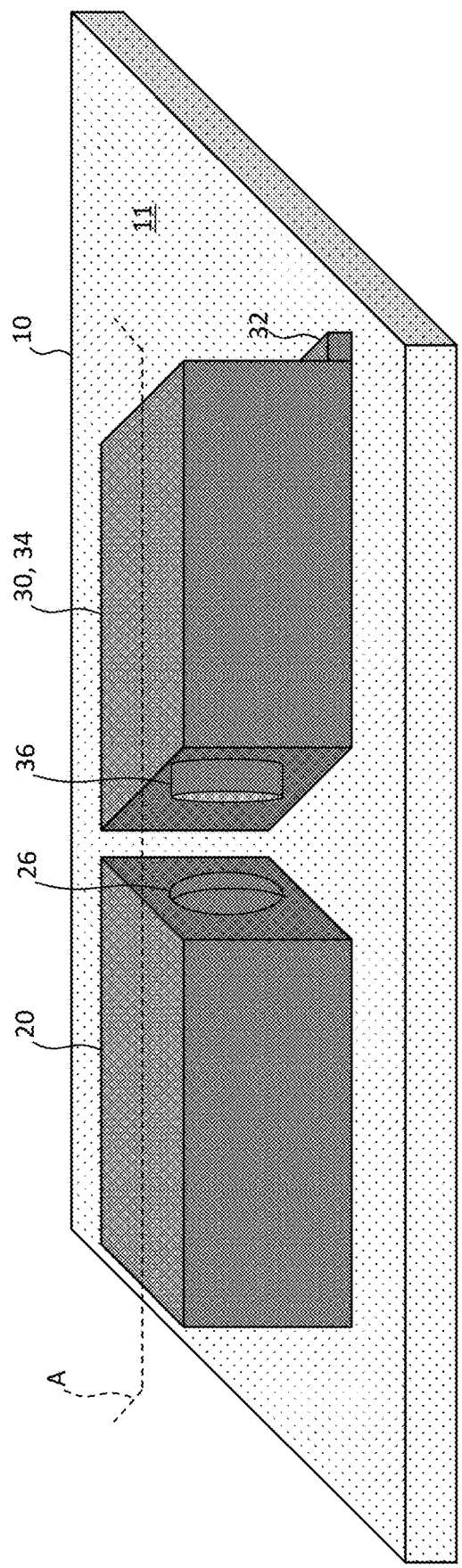
FIG. 11A is an exploded perspective of a printed structure with components shown at different angles.
Figure 11B:
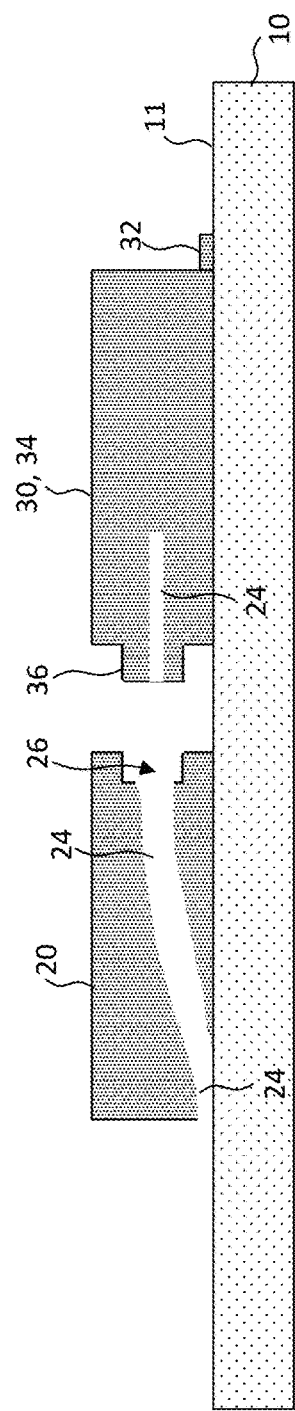
FIG. 11B is an exploded cross section taken along cross section line A of FIG. 11A.
Figure 11C:
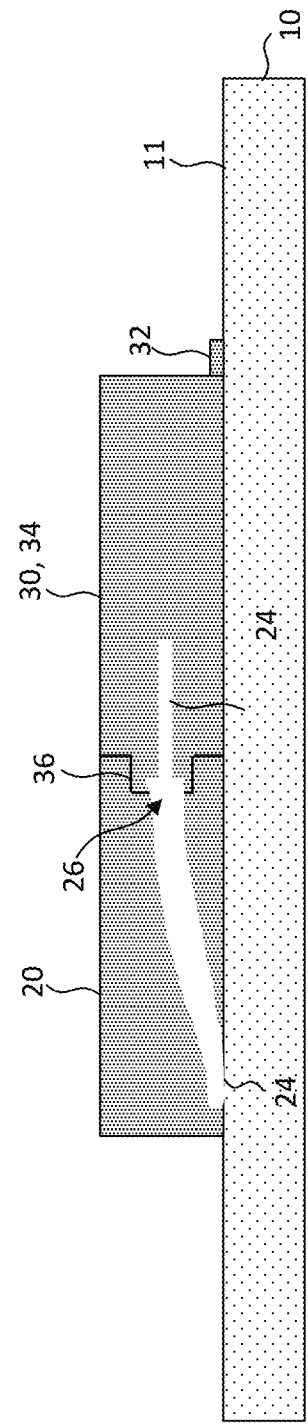
FIG. 11C is a cross section taken along cross section line A of FIG. 11A according to illustrative embodiments of the present disclosure.

For example, referring to FIGS. 11A-11C, a face of component 30 can have a protrusion 36 (e.g., an extension) opposing a face of structure 20 having a complementary indentation (e.g., a cavity) 26. One non-planar face can, for example, spatially, structurally, and physically complement a second non-planar face. In some embodiments, a face of component 30 has an indentation 26 opposing a face of structure 20 having a complementary protrusion 36. Such protrusions 36 and indentations 26 can have complementary shapes and serve to align components 30 to structures 20 as components 30 are transferred to target substrate 10. Complementary shapes can fit together, for example a protrusion can fit within an indentation (whether or not the protrusion and indentation have cross sections that are substantially similar in shape and/or size, for example an indentation can be larger than a protrusion). If present on a structure 20 and component 30, a protrusion 36 can be at least partially inserted into a complementary indentation 26 when component 30 is disposed in alignment with structure 20. FIG. 11A is an exploded illustration of component 30 on target substrate 10 in alignment with structure 20 using different perspectives for component 30 and structure 20 to illustrate how component 30 and structure 20 can fit together. FIG. 11B shows an exploded cross section of component 30 on target substrate 10 in alignment with structure 20. FIG. 11C is a cross section of component 30 on target substrate 10 in alignment with structure 20 and with protrusion 36 inserted into indentation 26 that aligns respective optical elements with each other. In FIGS. 11A-11C, complementary protrusion 36 and indentation 26 of component 30 and structure 20, respectively, have substantially the same size and shape.

Thus, according to some embodiments of the present disclosure, a structure 20 of printed structure 99 has a structure face and component 30 has a component face opposed to the structure face. In some embodiments, either (i) the structure face has an indentation 26 and the component face has a protrusion 36 complementary to indentation 26 (e.g., in size and/or shape), or (ii) the structure face has a protrusion 36 and the component face has an indentation 26 complementary to protrusion 36 (e.g., in size and/or shape) so that protrusion 36 can be inserted into indentation 26.

Figure 12:
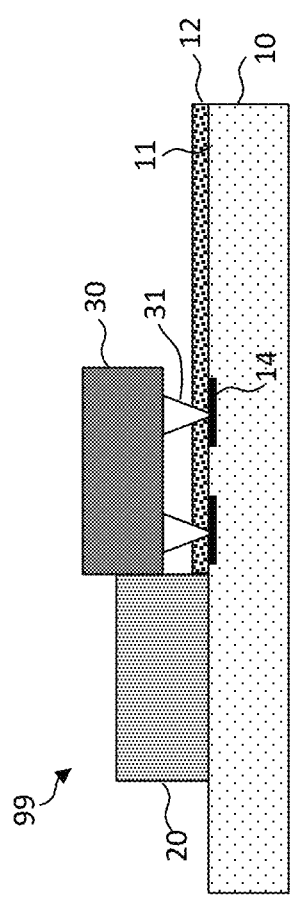

Referring to FIG. 12, according to some embodiments of the present disclosure, component 30 can comprise electrical connection posts 31 that provide an electrical connection from target substrate 10 to component 30. In some embodiments, connection posts 31 pierce or otherwise contact substrate contact pads 14 and are pressed into substrate contact pads 14, e.g., during micro-transfer printing, for example in step 160 or 200 (shown in FIG. 2B, 2D, or 2F) described above. In some embodiments, connection posts 31 are pressed into substrate contact pads 14 at least in part by reflowing a reflowable adhesive 12 (e.g., a resin). In some embodiments having components 30 with connection posts 31, it can be useful to contact structure 20 with component 30 before connection posts 31 of component 30 contact substrate contact pads 14 of target substrate 10. Connection posts 31 can be sharp (e.g., have a sharp point) for contacting or piercing an electrical contact pad, for example having a distal end with an area that is smaller (e.g., at least ten times smaller) than a base area. Connection posts 31 provide an electrical connection to component 30 without the need for subsequent photolithographic post processing to form electrodes 72, thus reducing the number of manufacturing steps.

Reference is made throughout the present description to examples of printing that are micro-transfer printing with stamp 40 comprising stamp post 42 when describing certain examples of printing components 30 (e.g., in describing FIGS. 2A-21). Similar other embodiments are expressly contemplated where a transfer element 40 that is not a stamp is used to similarly print components 30. For example, in some embodiments, a transfer element 40 that is a vacuum-based, magnetic, or electrostatic transfer element 40 can be used to print components 30. A component 30 can be adhered to a transfer element 40 with any type of force sufficient to maintain contact between the component 30 and transfer element 40 when desired and separate transfer element 40 from component 30 when desired. For example, component 30 can be adhered to transfer element 40 with one or more of an adhesion, electrostatic, van der Waals, magnetic, or vacuum force. In some embodiments, adhesion between component 30 and transfer element 40 occurs at least in part due to a force generated by operating transfer element 40 (e.g., an electrostatic force) and separation of transfer element 40 from component 30 occurs at least in part by ceasing provision of the force (e.g., an electrostatic force). Similar transfer elements 40 can be used to print structures 20. A vacuum-based, magnetic, or electrostatic transfer element 40 can comprise a plurality of transfer posts, each transfer post being constructed and arranged to pick up a single component 30 (similarly to stamp posts 42 in stamp 40).

According to some embodiments, micro-transfer printing can include any method of transferring components 30 from a component source wafer (e.g., a native source wafer) to a target substrate 10 by contacting components 30 on the component source wafer with a patterned or unpatterned stamp surface of a stamp 40 (e.g., a distal end of stamp post 42), removing (e.g., separating) components 30 from the component source wafer, transferring stamp 40 and contacted components 30 to target substrate 10, and contacting components 30 to a surface 11 of target substrate 10, for example adhesive layer 12 by moving stamp 40 or target substrate 10. Components 30 can be adhered to stamp 40 or target substrate 10 by, for example, van der Waals forces, electrostatic forces, magnetic forces, chemical forces, adhesives, or any combination of the above. In some embodiments, components 30 are adhered to stamp 40 with separation-rate-dependent adhesion, for example kinetic control of viscoelastic stamp materials such as can be found in elastomeric transfer elements or transfer devices such as a PDMS stamp 40. Stamps 40 can be patterned or unpatterned and can comprise stamp posts 42 having a stamp post area on the distal end of stamp posts 42. Stamp posts 42 can have a length, a width, or both a length and a width, similar or substantially equal to a length, a width, or both a length and a width of component 30.

In exemplary methods, a viscoelastic elastomer (e.g., PDMS) stamp 40 (e.g., comprising a plurality of stamp posts 42) is constructed and arranged to retrieve and transfer arrays of components 30 from their native component source wafer onto non-native patterned target substrates 10. In some embodiments, stamp 40 mounts onto motion-plus-optics machinery (e.g., an opto-mechatronic motion platform) that can precisely control stamp 40 alignment and kinetics with respect to both component source wafers and target substrates 10. During micro-transfer printing, the motion platform brings stamp 40 into contact with components 30 on the component source wafer, with optical alignment performed before contact. Rapid upward movement of the print-head (or, in some embodiments, downward movement of the component source wafer) breaks (e.g., fractures) or separates tether(s) 32 forming broken (e.g., fractured) or separated tethers 32, transferring component(s) 30 from native component source wafer to stamp 40 or stamp posts 42. Stamp 40 populated with components 30 then travels to patterned target substrate 10 (or vice versa) and one or more components 30 are then aligned to target substrate 10 and printed (for example as described in relation to FIGS. 1 and 2A-2H).

A component source wafer can be any source wafer or substrate with (e.g., native) transfer-printable components 30 that can be transferred with a transfer element 40 (e.g., a stamp 40). For example, a component source wafer can be or comprise a semiconductor (e.g., silicon) in a crystalline or non-crystalline form, a compound semiconductor (e.g., comprising GaN or GaAs), a glass, a polymer, a sapphire, or a quartz wafer. Sacrificial portions of native component source wafer enabling the release of components 30, for example by etching, can be formed of a patterned oxide (e.g., silicon dioxide) or nitride (e.g., silicon nitride) layer or can be an anisotropically etchable portion of a sacrificial layer of a component source wafer over which components 30 are disposed while also physically connected by tether 32 to an anchor of the component source wafer. Typically, component source wafers are smaller than patterned target substrates 10 and can have a higher density of components 30 disposed thereon than components 30 disposed on target substrate 10.

Components 30 can be any transfer-printable element, for example including any one or more of a wide variety of active or passive (or active and passive) components 30 (e.g., devices or subcomponents). Components 30 can be any one or more of integrated devices, integrated circuits (such as CMOS circuits), light-emitting diodes, photo-diodes, sensors, electrical or electronic devices, optical devices, opto-electronic devices, magnetic devices, magneto-optic devices, magneto-electronic devices, and piezo-electric device, materials or structures. Components 30 can comprise electronic component circuits electrically connected to electrodes 72 that operate component 30. Component 30 can be responsive to electrical energy, to optical energy, to electromagnetic energy, or to mechanical energy, or a combination thereof, for example. In some embodiments, an electro-optic device comprises component 30 (e.g., and, optionally, structure 20). In some embodiments, components 30 are light emitters, for example are one or more of light-emitting diodes, lasers, diode lasers, vertical-cavity surface-emitting lasers, micro-lasers, micro-light-emitting diodes, organic light-emitting diodes, inorganic light-emitting diodes, quantum-dot based light emitters, and super-luminescent diodes.

Components 30 formed or disposed in or on component source wafers can be constructed using integrated circuit, micro-electro-mechanical, or photolithographic methods for example. Components 30 can comprise one or more different component materials, for example non-crystalline (e.g., amorphous), polycrystalline, or crystalline semiconductor materials such as silicon or compound semiconductor materials or non-crystalline or crystalline piezo-electric materials. In some embodiments, component 30 comprises a layer of dielectric material, for example an oxide or nitride such as silicon dioxide or silicon nitride.

In certain embodiments, components 30 can be native to and formed on sacrificial portions of component source wafers and can include seed layers for constructing crystalline layers on or in component source wafers. Components 30, sacrificial portions, anchors, and tethers 32 can be constructed, for example using photolithographic processes. Components 30 can be micro-devices having at least one of a length and a width less than or equal to 200 microns, e.g., less than or equal to 100 microns, less than or equal to 50 microns, less than or equal to 25 microns, less than or equal to 15 microns, less than or equal to 10 microns, or less than or equal to five microns, and alternatively or additionally a thickness of less than or equal to 50 microns, e.g., less than or equal to 25 microns, less than or equal to 15 microns, less than or equal to 10 microns, less than or equal to five microns, less than or equal to two microns, or less than or equal to one micron. Components 30 can be unpackaged dice (each an unpackaged die) that, in some embodiments, are transferred directly from one or more (e.g., native) component source wafers on or in which components 30 are constructed to target substrate 10. Anchors and tethers 32 can each be or can comprise portions of a native component source wafer that are not sacrificial portions and can include layers formed on component source wafers, for example dielectric or metal layers and for example layers formed as a part of photolithographic processes used to construct or encapsulate components 30.

Target substrate 10 can be any destination substrate or target substrate to which components 30 are transferred (e.g., micro-transfer printed), for example flat-panel display substrates, printed circuit boards, or similar substrates can be used in various embodiments. Target substrates 10 can be, for example substrates comprising one or more of glass, polymer, quartz, ceramics, metal, and sapphire. Target substrates 10 can be semiconductor substrates (for example silicon) or compound semiconductor substrates. In some embodiments, target substrate 10 is a semiconductor substrate and comprises an electronic substrate circuit. Electronic substrate circuits can be electrically connected through electrodes 72 to control, provide signals to, or respond to component 30.

In some embodiments, a layer 12 of adhesive, such as a layer of resin, polymer, or epoxy, either curable or non-curable, adheres components 30 onto target substrate 10 and can be disposed, for example by coating or lamination. In some embodiments, an adhesive layer 12 is disposed in a pattern, for example disposed in locations on target substrate 10 where components 30 are to be printed (e.g., micro-transfer printed). A layer of adhesive can be disposed using inkjet, screening, or photolithographic techniques, for example. In some embodiments, adhesive layer 12 is coated, for example with a spray or slot coater, and then patterned, for example using photolithographic techniques. If an adhesive 12 is disposed over at least a portion of surface 11 of target substrate 10, a component 30 disposed on adhesive 12 is also said to be disposed on surface 11 of target substrate 10. In some embodiments, structures 20 are disposed on an adhesive 12. In some embodiments, components 30 are disposed on an adhesive 12. In some embodiments, both components 30 and structures 20 are disposed on an adhesive 12 (e.g., a common adhesive layer 12).

Patterned electrical conductors (e.g., wires, traces, or electrodes such as electrical substrate contact pads 14 found on printed circuit boards, flat-panel display substrates, and in thin-film circuits) can be formed on any combination of components 30, structures 20, and target substrate 10, and any one can comprise electrical conductors such as wires or electrical contact pads that electrically connect to components 30 or structures 20. Such patterned electrical conductors and electrodes (e.g., contact pads) can comprise, for example, metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface 11 or provided in micro-channels in or on target substrate 10.

Examples of micro-transfer printing processes suitable for disposing components 30 onto target substrates 10 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. Pat. No. 10,103,069 entitled Pressure Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. Pat. No. 10,224,460 entitled Micro-Assembled LED Displays and Lighting Elements, and U.S. Pat. No. 10,153,256, entitled Micro-Transfer Printable LED Component, the disclosure of each of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound micro-assembly structures and methods can also be used in certain embodiments, for example, as described in U.S. patent application Ser. No. 14/822,868, filed Aug. 10, 2015, entitled Compound Micro Assembly Strategies and Devices, which is hereby also incorporated by reference in its entirety. In some embodiments, any one or more of component 30, structure 20, and printed structure 99 is a compound micro-assembled structure (e.g., a compound micro-assembled macro-system).

According to various embodiments, a component source wafer (e.g., a native component source wafer) can be provided with components 30, patterned sacrificial portions, tethers 32, and anchors already formed, or they can be constructed as part of a method in accordance with certain embodiments. Component source wafers and components 30, transfer element 40 (e.g., a stamp 40), and target substrate 10 can be made separately and at different times or in different temporal orders or locations and provided in various process states.

The spatial distribution of any one or more of components 30 and structures 20 is a matter of design choice for the end product desired. In some embodiments, all components 30 in an array on a component source wafer are transferred to a transfer element 40. In some embodiments, a subset of components 30 in an array on a native component source wafer is transferred. By varying the number and arrangement of stamp posts 42 on transfer stamps 40, the distribution of components 30 on stamp posts 42 of transfer stamp 40 can be likewise varied, as can the distribution of components 30 and structures 20 on target substrate 10.

Structures 20 can be disposed in an array on target substrate 10. For example, structures 20 can be disposed by printing (e.g., micro-transfer printing) them onto target substrate 10. Structures 20 can be disposed in a regular array. Structures 20 can be disposed in an array having a linear density in one or two dimensions. The linear density can be, for example, no more than 200 structures 20 per mm and/or no less than 0.1 structure 20 per mm. Components 30 can be disposed in an array (e.g., a regular array) that corresponds to the array (e.g., regular array) in which structures 20 are disposed.

Because components 30, in certain embodiments, can be made using integrated circuit photolithographic techniques having a relatively high resolution and cost and target substrate 10, for example a printed circuit board, can be made using printed circuit board techniques having a relatively low resolution and cost, electrical conductors (e.g., electrodes 72) can be much larger than electrical contacts or component electrodes on component 30, thereby reducing manufacturing costs. For example, in certain embodiments, printable component 30 has at least one of a width, length, and height from 0.5 μm to 200 μm (e.g., 0.5 to 2 μm, 2 to 5 μm, 5 to 10 μm, 10 to 20 μm, 20 to 50 μm, or 50 to 100 μm, or 100 to 200 μm).

In certain embodiments, target substrate 10 is or comprises a member selected from the group consisting of polymer (e.g., plastic, polyimide, PEN, or PET), resin, metal (e.g., metal foil) glass, a semiconductor, and sapphire. In certain embodiments, a target substrate 10 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

Components 30, in certain embodiments, can be constructed using foundry fabrication processes used in the art. Layers of materials can be used, including materials such as metals, oxides, nitrides and other materials used in the integrated-circuit art. Each component 30 can be or include a complete semiconductor integrated circuit and can include, for example, any combination of one or more of a transistor, a diode, a light-emitting diode, and a sensor. Components 30 can have different sizes, for example, at least 100 square microns (e.g., at least 1,000 square microns, at least 10,000 square microns, at least 100,000 square microns, or at least 1 square mm). Alternatively or additionally, components 30 can be no more than 100 square microns (e.g., no more than 1,000 square microns, no more than 10,000 square microns, no more than 100,000 square microns, or no more than 1 square mm). Components 30 can have variable aspect ratios, for example from 1:1 to 10:1 (e.g., 1:1, 2:1, 5:1, or 10:1). Components 30 can be rectangular or can have other shapes, such as polygonal or circular shapes for example.

Various embodiments of structures and methods were described herein. Structures and methods were variously described as transferring components 30, printing components 30, or micro-transferring components 30. In some embodiments, micro-transfer-printing involves using a transfer element 40 (e.g., an elastomeric stamp 40, such as a PDMS stamp 40) to transfer a component 30 using controlled adhesion. For example, an exemplary transfer device can use kinetic or shear-assisted control of adhesion between a transfer element and a component 30. It is contemplated that, in certain embodiments, where a method is described as including printing (e.g., micro-transfer-printing) a component 30, other similar embodiments exist using a different transfer method. In some embodiments, transferring or printing a component 30 (e.g., from a native component source substrate or wafer to a destination patterned target substrate 10) can be accomplished using any one or more of a variety of known techniques. For example, in certain embodiments, a pick-and-place method can be used to print components 30 or structures 20. As another example, in certain embodiments, a flip-chip method can be used (e.g., involving an intermediate, handle or carrier substrate). In methods according to certain embodiments, a vacuum tool, an electro-static tool, a magnetic tool, or other transfer device is used to transfer a component 30.

The figures that show transfer element 40 are simplified to show transfer element 40 printing a single component 30. In some embodiments, a single component 30 is printed using transfer element 40 in a single print step. Accordingly, 10 components 30 can be printed using transfer element 40 in 10 print steps. In some embodiments, a plurality of components are printed using transfer element 40 in a single print step. For example, in some embodiments, at least 10 components 30, e.g., at least 50 components 30, at least 100 components 30, at least 1,000 components 30, at least 10,000 components 30, or at least 50,000 components 30 can be or are printed in a single print step.

As is understood by those skilled in the art, the terms "over" and "under" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact).

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST

A cross section line
D distance

M movement direction
10 target substrate
11 surface
12 optional adhesive/optional adhesive layer
14 substrate contact pad
20 structure
20A first structure
20B second structure
24 light pipe
25 reflector
26 indentation
30 component
30A first component
30B second component
31 connection post
32 tether
34 micro-laser/micro-diode laser
36 protrusion
38 component substrate
40 stamp/transfer element
42 stamp post
50 lower light-reflective layer
52 upper light-reflective layer
60 light
70 integrated circuit
72 electrode
74 dielectric layer/encapsulation layer
76 photosensor
99 printed structure
100 provide substrate step
110 provide source substrate step
120 provide stamp step
130 pick up components with stamp step
140 form structures on substrate step
150 optional dispose adhesive step
160 print components onto substrate with stamp step
170 separate stamp step
180 optional cure adhesive step
200 press component toward target substrate step
210 separate stamp from component step

What is claimed is:

1. A printed structure, comprising:
    a target substrate and a structure protruding from a surface of the target substrate; and
    a component in alignment with the structure, the component comprising a component substrate separate and independent from the target substrate,
    wherein the component is disposed on the surface of the target substrate laterally adjacent to and within one micron of a top of the structure, and
    wherein the component comprises a broken or separated tether.

2. The printed structure of claim 1, wherein the component is in contact with the structure.

3. The printed structure of claim 1, wherein the structure comprises a broken or separated tether.

4. The printed structure of claim 1, wherein the component and the structure are aligned optical elements on the surface of the target substrate.

5. The printed structure of claim 1, wherein either or both of the component and the structure comprise one or more of a laser, a light-emitting diode, a light sensor, and an optical fiber.

6. The printed structure of claim 1, wherein the component has a length or a width or a length and a width less than or equal to 200 microns.

7. The printed structure of claim 1, wherein (i) the structure has a flat face adjacent to the component, (ii) the component has a substantially flat face adjacent to the structure, or (iii) both (i) and (ii).

8. The printed structure of claim 7, wherein the structure has a flat face substantially orthogonal to the surface of the target substrate.

9. The printed structure of claim 1, wherein the structure, the component, or both the structure and the component are operable to receive or emit light.

10. The printed structure of claim 9, wherein the component is disposed and operable to emit light to or receive light from the substrate, wherein the structure is disposed and operable to emit light to or receive light from the substrate, or wherein the component is disposed and operable to emit light to or receive light from the structure.

11. The printed structure of claim 9, comprising a controller disposed on the surface of the substrate and wherein (i) the controller is electrically connected to the component and operable to control operation of the component, (ii) the controller is electrically connected to the structure and operable to control operation of the structure, or (iii) both (i) and (ii).

12. The printed structure of claim 1, comprising an encapsulation layer disposed at least partly over the component, the structure, and any gap between the component and the structure.

13. The printed structure of claim 12, wherein the encapsulation layer comprises or is coated with a light-reflective layer.

14. The printed structure of claim 1, wherein the component has a thickness equal to or greater than a thickness of the structure.

15. The printed structure of claim 1, wherein the component comprises a component material, the target substrate comprises a substrate material, and the component material is substantially different from the substrate material.

16. The printed structure of claim 1, comprising a reflective material disposed (i) between the component and the target substrate, (ii) between the structure and the target substrate, or (iii) both (i) and (ii).

17. The printed structure of claim 1, wherein the component is a first component and the printed structure comprises a second component disposed on the surface of the target substrate within one micron of the first component and the second component comprises a broken or separated tether.

18. The printed structure of claim 1, wherein the component comprises connection posts.

19. The printed structure of claim 1, wherein a height of the structure over the target substrate is less than or equal to a height of the component over the target substrate.

20. The printed structure of claim 1, wherein the structure has a side adjacent to the component that is substantially at 90 degrees or more to the surface of the target substrate.

21. The printed structure of claim 1, wherein the component is disposed on the surface of the target substrate within 0.75 microns of the structure.

22. A printed structure, comprising:
    a substrate and a structure protruding from a surface of the substrate; and
    a component in alignment with the structure, the component comprising a component substrate separate and independent from the substrate,
    wherein the component is disposed on the surface of the substrate within one micron of a top of the structure and not on the structure, and wherein the component comprises a broken or separated tether.

23. A printed structure, comprising:
a substrate and a structure protruding from a surface of the substrate; and
a component in alignment with the structure, the component comprising a component substrate separate and independent from the substrate,
wherein the component is disposed on the surface of the substrate laterally adjacent to and within one micron of a top of the structure, and
wherein the component is non-native to the substrate.

24. The printed structure of claim 23, wherein the structure is non-native to the substrate.

* * * * *